(12) United States Patent
Suito et al.

(10) Patent No.: US 9,870,828 B2
(45) Date of Patent: *Jan. 16, 2018

(54) NON-VOLATILE SEMICONDUCTOR MEMORY AND ERASING METHOD THEREOF

(71) Applicant: Winbond Electronics Corp., Taichung (TW)

(72) Inventors: Katsutoshi Suito, Taichung (TW); Riichiro Shirota, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/277,992

(22) Filed: Sep. 27, 2016

(65) Prior Publication Data

US 2017/0092368 A1   Mar. 30, 2017

(30) Foreign Application Priority Data

Sep. 28, 2015 (JP) ................... 2015-189757

(51) Int. Cl.
*G11C 16/14* (2006.01)
*G11C 16/34* (2006.01)
(Continued)

(52) U.S. Cl.
CPC .......... *G11C 16/14* (2013.01); *G11C 16/0483* (2013.01); *G11C 16/344* (2013.01);
(Continued)

(58) Field of Classification Search
CPC ... G11C 16/14; G11C 16/0483; G11C 16/344; G11C 16/3445; G11C 16/345;
(Continued)

(56) References Cited

U.S. PATENT DOCUMENTS 5,909,392 A * 6/1999 Chang ................ G11C 16/0483
                                                    365/185.12
6,134,140 A * 10/2000 Tanaka ................ G11C 11/5621
                                                    365/185.03
(Continued)

FOREIGN PATENT DOCUMENTS

JP    H09320287    12/1997
JP    2007035214    2/2007
(Continued)

OTHER PUBLICATIONS

Schwank et al., "Radiation Effects in MOS Oxides," IEEE Transactions on Nuclear Science, Aug. 2008, pp. 1833-1853.
(Continued)

*Primary Examiner* — Ly D Pham
(74) *Attorney, Agent, or Firm* — JCIPRNET

(57) ABSTRACT

An erasing method of a nonvolatile semiconductor memory device of the disclosure includes erasing data of a selected memory cell (step S100); immediately applying a programming voltage lower than a programming voltage in a programming time to all control gates of the selected memory cell after the erasing step, thereby performing a week programming (step S110); performing a erasing verification of the selected memory cell (step S120).

15 Claims, 9 Drawing Sheets

(51) Int. Cl.
  *G11C 16/10* (2006.01)
  *G11C 16/04* (2006.01)
  *H01L 27/11524* (2017.01)
(52) U.S. Cl.
  CPC ........ *G11C 16/345* (2013.01); *G11C 16/3445* (2013.01); *G11C 16/3472* (2013.01); *G11C 16/3477* (2013.01); *G11C 16/3459* (2013.01); *H01L 27/11524* (2013.01)
(58) Field of Classification Search
  CPC ............ G11C 16/3472; G11C 16/3477; G11C 16/3459; H01L 27/11524
  USPC .......................... 365/185.29, 185.33, 185.22
  See application file for complete search history.

(56) References Cited

U.S. PATENT DOCUMENTS

| | | | | |
|---|---|---|---|---|
| 6,532,175 | B1* | 3/2003 | Yachareni | G11C 16/3459 365/185.22 |
| 7,057,949 | B1* | 6/2006 | Pan | G11C 16/30 365/203 |
| 2002/0008996 | A1* | 1/2002 | Hirano | G11C 16/344 365/185.33 |
| 2003/0147279 | A1* | 8/2003 | Pan | G11C 16/3404 365/185.3 |
| 2006/0044919 | A1* | 3/2006 | Taoka | G11C 16/107 365/230.03 |
| 2009/0135659 | A1* | 5/2009 | Jones | G11C 16/14 365/185.29 |
| 2010/0149881 | A1* | 6/2010 | Lee | G11C 11/5635 365/185.33 |
| 2010/0172188 | A1* | 7/2010 | Chen | G11C 16/3409 365/185.22 |
| 2015/0049555 | A1* | 2/2015 | Mu | G11C 16/3459 365/185.22 |

FOREIGN PATENT DOCUMENTS

| | | |
|---|---|---|
| JP | 2007102923 | 4/2007 |
| JP | 2011014817 | 1/2011 |
| JP | 2012027979 | 2/2012 |
| KR | 20090015278 | 2/2009 |
| KR | 20110078751 | 7/2011 |
| WO | 9818132 | 4/1998 |

OTHER PUBLICATIONS

"Office Action of Korea Counterpart Application", dated Dec. 15, 2016, p. 1-p. 9.

"Office Action of Japan Counterpart Application", dated Nov. 15, 2016, p. 1-p. 15.

* cited by examiner

NON-VOLATILE SEMICONDUCTOR MEMORY AND ERASING METHOD THEREOF

CROSS-REFERENCE TO RELATED APPLICATION

This application claims the priority benefit of Japan application serial no. 2015-189757, filed on Sep. 28, 2015. The entirety of the above-mentioned patent application is hereby incorporated by reference herein and made a part of this specification.

BACKGROUND OF THE INVENTION

Field of the Invention

The invention relates to reliability of a NAND (not AND) type or NOR (not OR) type flash memory, and particularly relates to an erasing method of a flash memory with less reliability deterioration even if programming and erasing operations are repeatedly performed.

Description of Related Art

FIG. 1 is a schematic cross-sectional view of a cell array of a NAND-type flash memory. An N-well 12 is formed in a P-type silicon substrate 10, and a P-well 14 is formed in the N-well 12. A plurality of transistors constructing a NAND string is formed in the P-well 14. One NAND string includes a plurality of memory cells connected in series, a source line selection transistor connected to an end of the memory cells, and a bit line selection transistor connected to another end of the memory cells. In FIG. 1, a plurality of memory cells 20 connected in series, a source line selection transistor 22, and a bit line selection transistor 24 are illustrated. A plurality of such NAND strings is formed in the P-well 14 along a row direction, and the NAND strings in one P-well 14 construct one block.

A source line SL is electrically connected to an n-diffusion region (a source region) 23 of the source line selection transistor 22, and a bit line BL is electrically connected to an n-diffusion region (a drain region) 23 of the bit line selection transistor 24. Moreover, a p+ diffusion region 26 for a contact is formed in the P-well 14, and an n+ diffusion region 27 is formed in the N-well 12, and the two diffusion regions 26 and 27 are connected through a contact 28 commonly used by the N-well/P-well. According to following description, when an erasing operation is to be performed to a selected block, an erasing pulse of a high voltage of the P-well is applied through the commonly used contact 28.

FIG. 2 is an equivalent circuit diagram of a cell array of a NAND-type flash memory. As shown in FIG. 2, a plurality of word lines WL1, WL2, . . . , WLn is formed along a row direction intersected with the NAND strings, and each of the word lines WL is commonly connected to control gates of the corresponding memory cells 20 in the row direction. A selection gate line SGS is commonly connected to gates of the source line selection transistors 22 in the row direction, and a selection gate line SGD is commonly connected to gates of the bit line selection transistors 24 in the row direction. When the source line selection transistors 22 are turned on through the selection gate line SGS, the NAND strings are electrically connected to the source line SL, and when the bit line selection transistors 24 are turned on through the selection gate line SGD, the NAND strings are electrically connected to the bit line BL.

FIG. 3 is a diagram illustrating voltage waveforms of nodes in an erasing selected block of the NAND-type flash memory when an erasing pulse is applied. A node N1 represents the contact 28 commonly used by the N-well/P-well, a node N2 represents the diffusion region 23 used by the contact of the source line SL, a node N3 represents a gate of the source line selection transistor 22, a node N4 represents a word line (control gates) of the memory cells 20 in a same block, a node N5 represents a gate of the bit line selection transistor 24, and a node N6 represents a waveform of the diffusion region 23 used by the contact of the bit line BL. Moreover, in a non-selected block, the node N4 has the same voltage waveform with that of the node N3 or N5 in the erasing selected block.

In the NAND-type flash memory, data is erased block by block. At this time, the word line of the selected block is set to 0V or a voltage lower than that of the P-well 14, and an erasing pulse Ps of a strip-type positive voltage is applied to the P-well 14 that forms the memory cell array, and after the erasing pulse Ps is applied, the potential of the P-well 14 is restored to 0V. At this time, the voltage of each of the nodes N2, N3, N5 and N6 is automatically boosted through capacitance coupling with the P-well 14. After the erasing operation, it is determined whether threshold values of the memory cells in the selected block are below a certain value through verification read out. If the threshold values of all of the memory cells in the block are below the certain value, the erasing operation is completed, and if the threshold values of a part of the memory cells are above the certain value, the erasing pulse Ps is again applied to again perform the verification read out (for example, a patent literature 1).

Moreover, in order to control a lower limit of a threshold distribution amplitude of the erased memory cells, soft programming is performed to the erased memory cells, and soft programming verification is performed (for example, a patent literature 2). The above flow is shown in FIG. 4, as shown in FIG. 4, following control is implemented: an erasing pulse Ps is applied in order to erase data of the selected memory cells (step S10). Then, erasing verification is executed for verifying whether an upper limit of threshold values of the memory cells is below a fixed value (S20), and if it is verified to be success in the erasing verification, the soft programming verification is executed for verifying whether a lower limit of the threshold values of the memory cells is above a fixed value (S40). Soft programming is executed to the memory cells failed in the soft programming verification (S30), such that the lower limit of the threshold distribution amplitude is above the fixed value.

On the other hand, during a writing (programming) operation, the P-well 14 is set to 0V, and a high voltage is applied to the selected word line. The bit line BL is applied with 0V or a positive potential, and in case of 0V, a silicon surface of the selected memory cell is 0V, and a tunnel current of electrons flows from the silicon substrate towards a floating gate. Therefore, the threshold value of the memory cell becomes higher than a certain specified value.

Patent literature 1: Japan Patent Publication No. 2012-027979

Patent literature 2: Japan Patent Publication No. 2007102923

In the past flash memories such as the NAND-type flash memory, if an erasing/programming (data rewriting) operation is repeatedly performed, performance of an oxide film under the floating gate is deteriorated, such that a conductance (Gm) is deteriorated due to trapping of holes/electrons of the oxide film. Moreover, a data retention characteristic is aggravated. Therefore, data rewriting times is limited, and when the data rewriting times is above the limitation, reliability of the flash memory can not be guaranteed.

Factors that cause the oxide film deterioration are plural, and it is known that during a period of applying the erasing pulse to the P-well till applying a programming pulse, the oxide film deterioration exists. By changing an interval of applying the erasing pulse to the P-well till applying the programming pulse to the word line to repeatedly rewrite data, an experiment result of measuring an I-V characteristic of the memory cell in the programming state is shown in FIG. 5(a). To be specific, regarding the interval from erasing to programming, three intervals of 0.05 second (▲), 0.5 second (■) and 5 seconds (●) are provided to compare the I-V characteristic of the memory cell when the number of programming/erasing (P/E) cycles is 1000 and the I-V characteristic of the initial, un-programmed and fresh memory cell. According to the experiment result, it is known that the smaller the interval is, the more the I-V characteristic of the repeatedly programmed/erased memory cell being closed to the I-V characteristic of the initial and fresh memory cell. In other words, the larger the interval is, the larger the I-V characteristic deviates, and the larger the deterioration of the conductance Gm is.

FIG. 5(b) is a graph showing a relationship between the number of P/E cycles and shift amounts of the threshold values of the memory cells, in which a horizontal axis represents the number of P/E cycles, and a vertical axis represents the shift amounts of the threshold values Vth of the memory cells, and according to the experiment result, the shift amount of the memory cell with the smallest interval (0.05 second) is the smallest, and the shift amount is increased as the interval is increased. Namely, it is known that the greater the interval of the memory cell is, the higher a trapping energy level of the silicon interface is, and therefore the less a potential dependency of the control gate of the I-V characteristic is, which is regarded as the oxide film deterioration caused by placement after the erasing pulse is applied, and the oxide film deterioration may aggravate reliability of the subtle memory cells to cause reduction of data rewriting times with guaranteed reliability.

FIG. 6 is a graph showing influences on deterioration of the conductance Gm caused by an interval Tp_e from programming to erasing and an interval Te_p from erasing to programming, in which a horizontal axis represents the number of P/E cycles, and a vertical axis represents a variation proportion relative to a drain current flowing through the initial memory cell. Moreover, ▲ represents a situation that the interval Tp_e and the interval Te_p are all short, ● represents a situation that the interval Tp_e is long and the interval Te_p is short, and ■ represents a situation that the interval Tp_e and the interval Te_p are all long. When the number of the P/E cycles reaches 1000, the memory cell with the short interval Tp_e and the short interval Te_p has the smallest conductance deterioration, the memory cell with the long interval Tp_e and the short interval Te_p has the second smallest conductance deterioration, and the memory cell with the long interval Tp_e and the long interval Te_p has the largest conductance deterioration. Here, in the memory cell with the short interval Te_p (▲ and ●), the conductance deterioration nearly has no difference, so that the interval Tp_e does not has a great influence on the conductance deterioration. Namely, compared to the interval Tp_e, the interval Te_p has a larger influence on the oxide film deterioration. In other words, compared to a placing time of the memory cells after the programming operation, a placing time of the memory cells after the erasing operation may cause larger influence on the oxide film deterioration, and compared to the electrons, the holes more dominate deterioration of the tunnel oxide film.

FIG. 7 is a cross-sectional view of a memory cell applied with the erasing pulse Ps, and FIG. 8 is a band diagram between the floating gate and the silicon substrate when the erasing pulse is applied. As shown in FIG. 7, when a voltage of 0V is applied to a control gate 30, the erasing pulse Ps is applied to the P-well 14, and a high voltage is applied to a tunnel oxide film 34 located right below a floating gate 32, the electrons flow from the floating gate 32 to the silicon substrate based on an FN tunneling effect. As a result, when the erasing operation is ended, the floating gate 32 carries positive charges. As shown in FIG. 8, the electrons reaching the silicon substrate have high energy to produce holes with high energy, and a part of the holes is injected into the oxide film 34.

FIG. 9 is a band diagram of the memory cell applied with the erasing pulse when the threshold value thereof is below 0V. Regarding the holes injected into the oxide film 34 when the erasing pulse is applied, if the floating gate 32 carries the positive charges when the P-well 14 is set to 0V, the floating gate 32 has a positive potential relative to the silicon surface due to the positive charges. Therefore, the holes in the oxide film 34 slowly move toward the silicon substrate due to a self electric field in the oxide film (the Pool-Frenkel current). A part of the holes reaching the silicon interface is trapped by the oxide film to form an interface energy level. During read verification, the P-well is fixed to 0V, the word line becomes 0V or a certain positive potential, and the phenomenon that the holes move towards the silicon substrate is not changed. Therefore, in the past erasing method, during the period after the erasing pulse is applied, the holes move towards the silicon interface to form the interface energy level.

SUMMARY OF THE INVENTION

The invention is directed to a non-volatile semiconductor memory device capable of suppressing reliability deterioration caused by data rewriting, so as to resolve the problems of the related art.

The invention provides an erasing method of a non-volatile semiconductor memory device, the non-volatile semiconductor memory device includes a memory array that forms a plurality of memory cells, where the memory cell includes a control gate, a charge storage layer and a channel region. The erasing method includes following steps. A selecting step: selecting the memory cell to be erased from the memory array. An erasing step: applying an erasing voltage to the channel region of the selected memory cell, and erasing data of the charge storage layer of the selected memory cell. A weak programming step: immediately applying a weak programming voltage lower than a programming voltage in a programming time to all of the control gates of the selected memory cell after the erasing step, thereby uniformly performing week programming to the selected memory cell.

The invention provides a non-volatile semiconductor memory device including a memory array that forms a plurality of memory cells, where the memory cell includes a control gate, a charge storage layer and a channel region; a selection component, which is used for selecting the memory cell to be erased from the memory array; and an erasing component, which is used for erasing data of the memory cell selected by the selection component, where the erasing component applies an erasing voltage to the channel region of the selected memory cell to erase data of the charge storage layer of the selected memory cell, and after the erasing voltage is applied, the erasing component immediately applies a weak programming voltage lower than a programming voltage in a programming time to all of the control gates of the selected memory cell, so as to uniformly perform week programming to the selected memory cell.

In the invention, the weak programming is immediately executed after the erasing step, such that trapping of the charges by the insulation film occurred during the erasing step is suppressed. Therefore, compared to the existing technique of suppressing deterioration of the insulation film, the data rewriting times with guaranteed reliability is increased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5(a) is a graph showing an initial I-V characteristic and an I-V characteristic after 1000 times of data programming, and FIG. 5(b) is a graph showing a relationship between the number of P/E cycles and shift amounts of threshold values.

DESCRIPTION OF EMBODIMENTS

Embodiments of the invention are described in detail below with reference of figures. Moreover, it should be noticed that in the figures, some parts are emphasized for easy understanding and are not necessarily drawn to scale.

Figure 10:
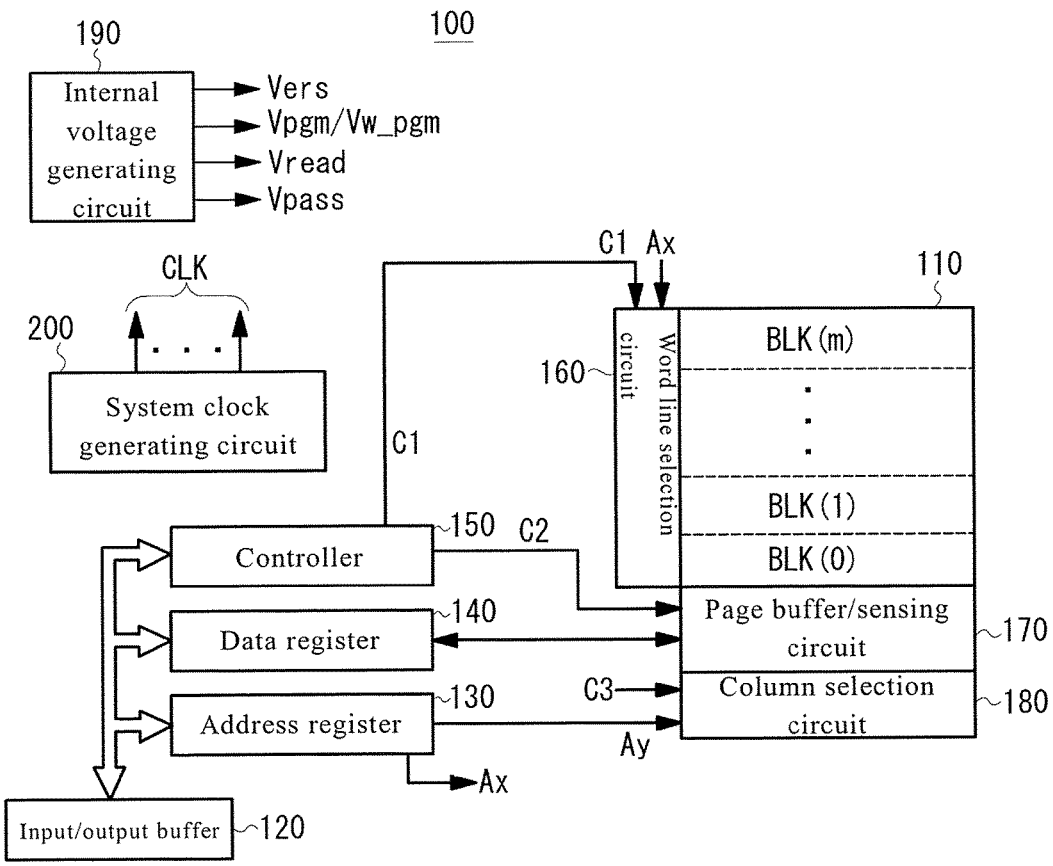
FIG. 10 is a block diagram of a configuration example of a NAND-type flash memory according to an embodiment of the invention.

FIG. 10 is a block diagram of a configuration example of a NAND-type flash memory according to an embodiment of the invention. Referring to FIG. 10, the flash memory 100 includes a memory array 110, which forms a plurality of memory cells arranged in an array; an input/output buffer 120, which is connected to an external input/output terminal I/O to retain input/output data; an address register 130, which receives address data from the input/output buffer 120; a data register 140, which stores the input/output data; a controller 150, which provides control signals C1, C2, C3, etc., where the control signals C1, C2, C3, etc., control various parts of the flash memory 100 based on command data from the input/output buffer 120 and external control signals (a chip enabling signal or an address latch enabling signal, etc., not shown); a word line selection circuit 160, which decodes row address information Ax from the address register 130, and implements block selection and word line selection, etc. according to a decoded result; a page buffer/sensing circuit 170, which retains data read through a bit line, or data programmed through the bit line; a column selection circuit 180, which decodes column address information Ay from the address register 130, and implements bit line selection according to a decoded result; an internal voltage generating circuit 190, which generates voltages (for example, a programming voltage Vpgm, a pass voltage Vpass, a reading voltage Vread, an erasing voltage Vers, a weak programming voltage Vw_pgm, etc.) required for reading, programming (writing) and erasing data; and a system clock generating circuit 200, which generates an internal system clock CLK.

Figure 1:
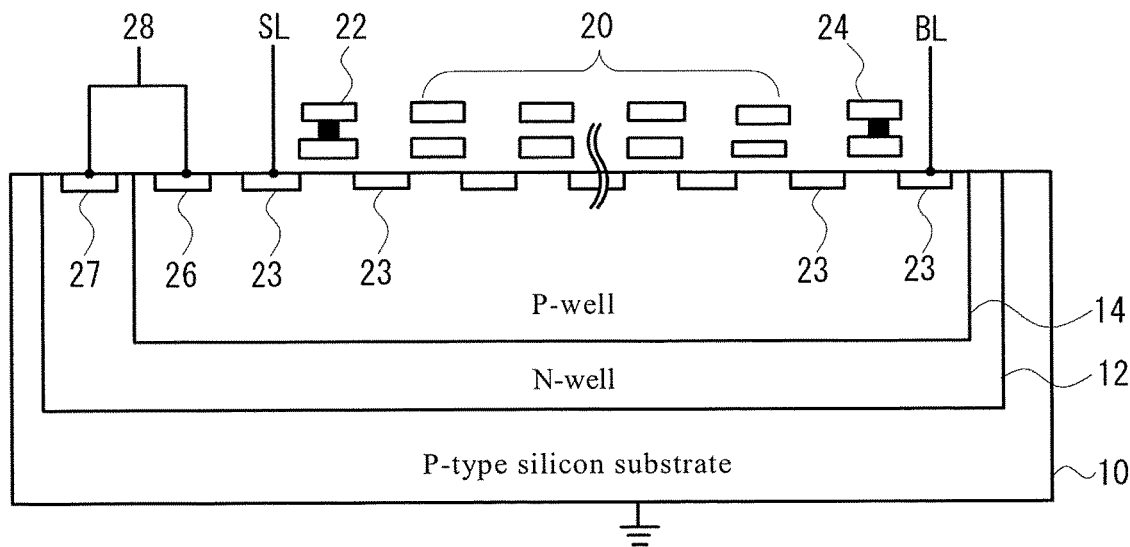
FIG. 1 is a cross-sectional view of a cell array of a NAND-type flash memory.
Figure 2:
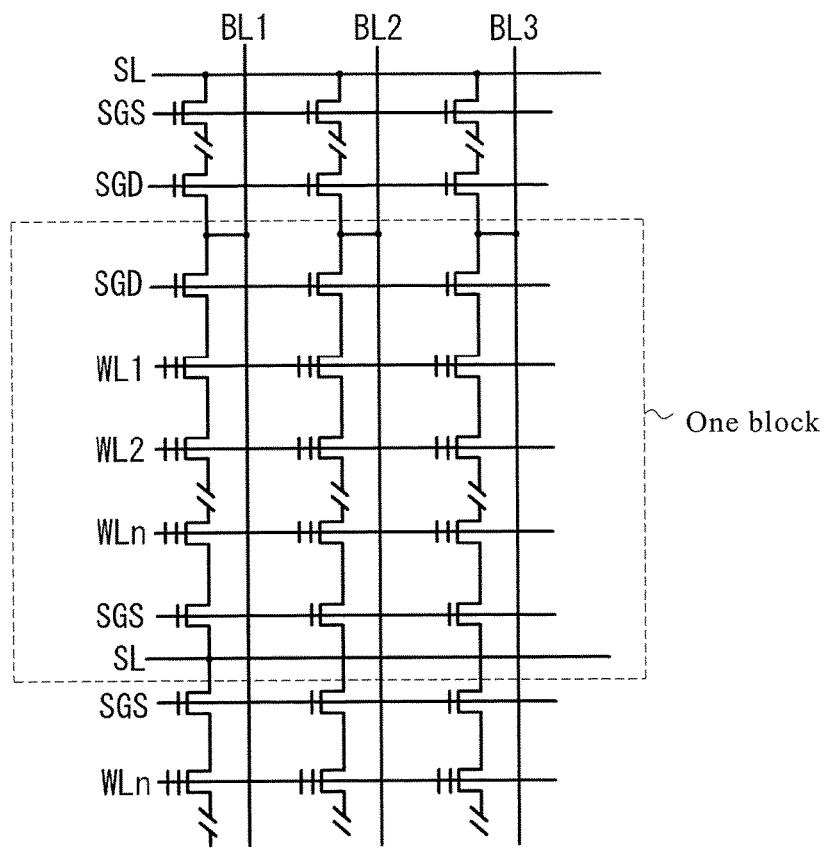
FIG. 2 is an equivalent circuit diagram of a cell array of a NAND-type flash memory.
Figure 3:
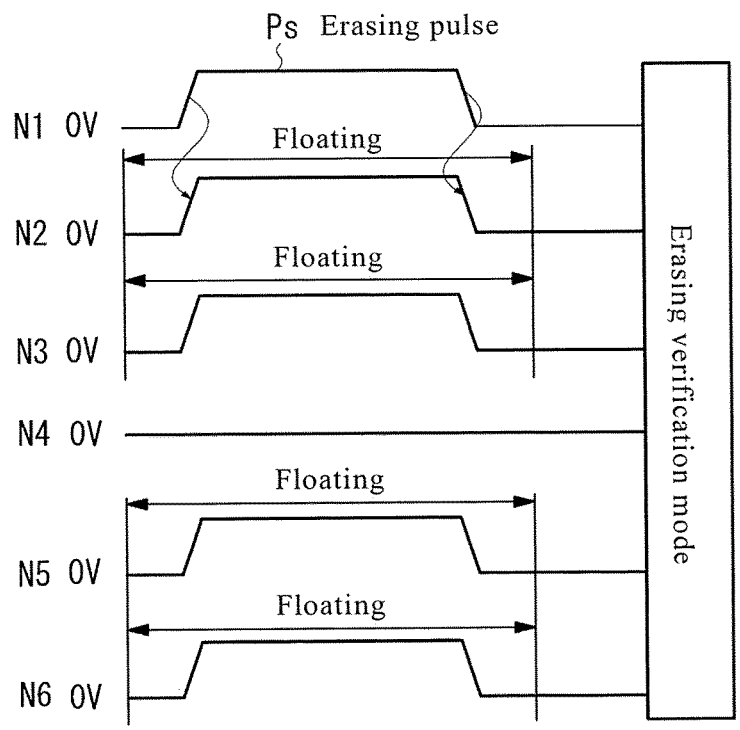
FIG. 3 is a diagram illustrating voltage waveforms of each node in an erasing selected block of the NAND-type flash memory when an erasing pulse is applied.
Figure 4:
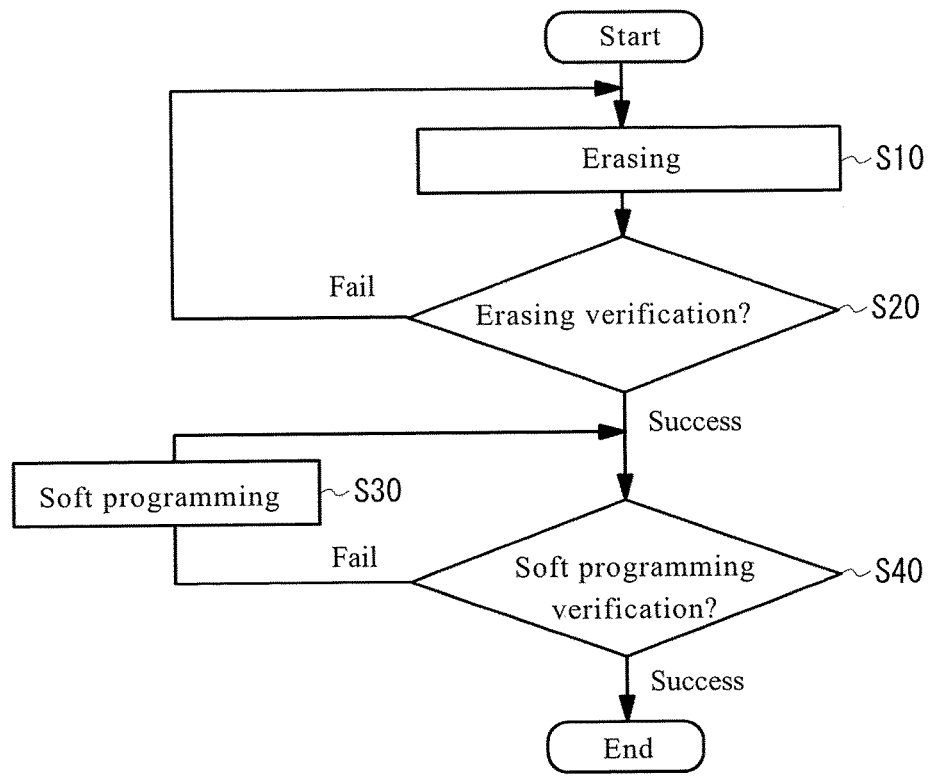
FIG. 4 is a flowchart illustrating a soft programming method of a flash memory.
Figures 5A, 5B:
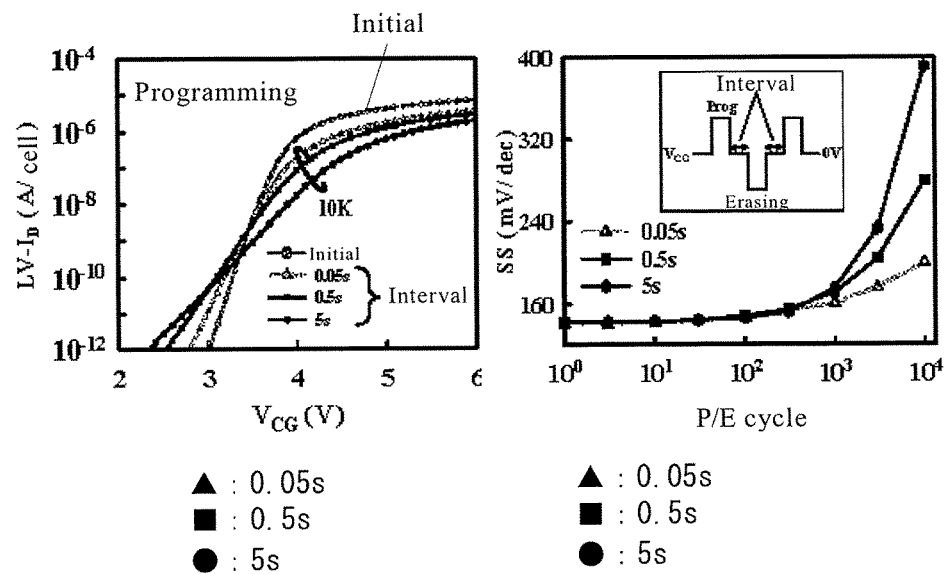
FIG. 5(a) and FIG. 5(b) are graphs showing interval dependency of an I-V characteristic of memory cells from erasing to programming.
Figure 6:
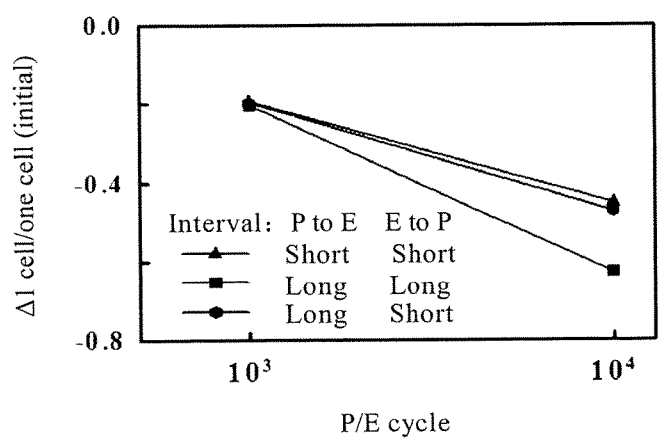
FIG. 6 is a graph showing a relationship between conductance deterioration and an interval from programming to erasing and an interval from erasing to programming after 1000 times of rewriting.
Figure 7:
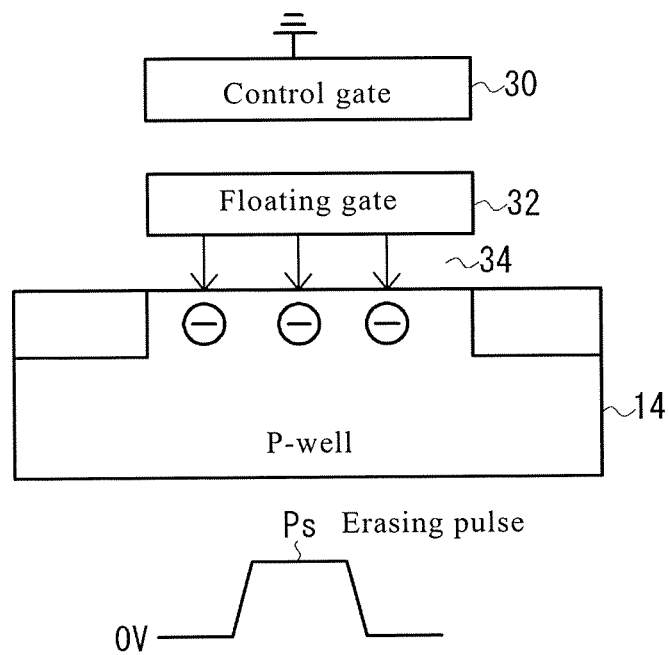
FIG. 7 is a cross-sectional view of a memory cell applied with an erasing pulse Ps.
Figure 8:
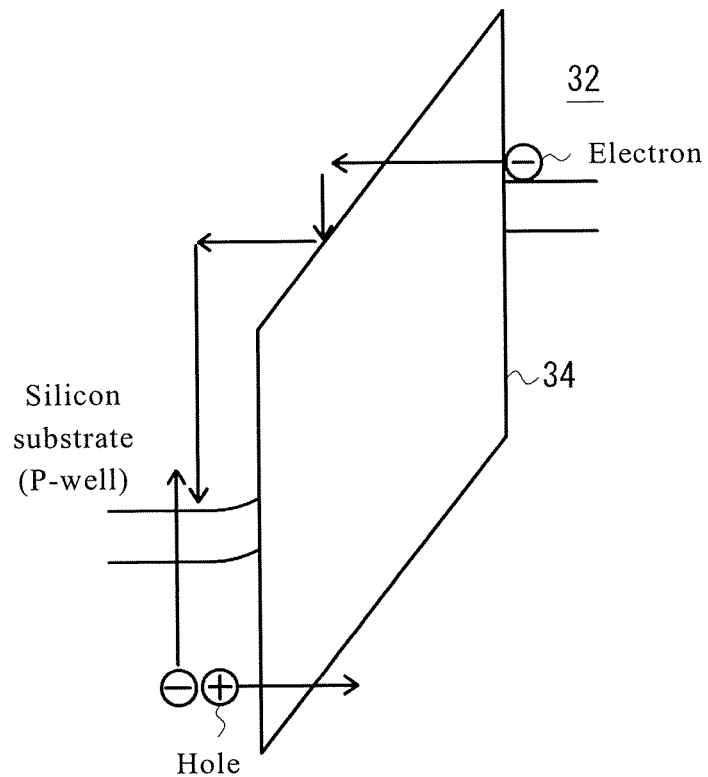
FIG. 8 is a band diagram between a floating gate and a silicon substrate when the erasing pulse is applied.
Figure 9:
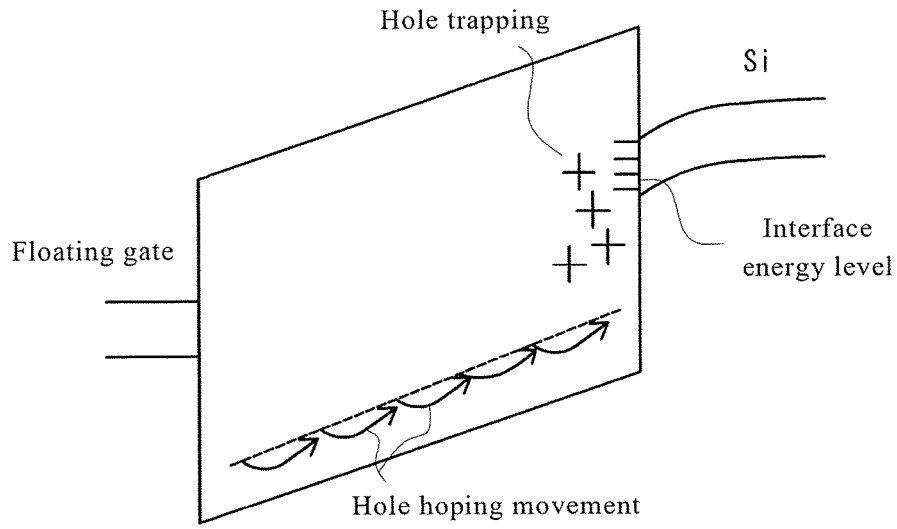
FIG. 9 is a band diagram of a memory cell applied with the erasing pulse of a conventional example when a threshold value thereof is below 0V.

As shown in FIG. 2, the memory array 110 includes a plurality of NAND strings formed by connecting a plurality of memory cells in series. The memory cell has a metal oxide semiconductor (MOS) structure, and the MOS structure includes source/drain serving as n+ diffusion regions and formed in a P-well; a tunnel oxide film formed on a channel region between the source and the drain; a floating gate (charge storage layer) formed on the tunnel oxide film; and a control gate formed on the floating gate through a dielectric film. Typically, when positive charges are trapped in the floating gate, i.e., data "1" is written therein, a threshold value has a negative state, and the memory cell is turned on when the control gate is 0V. When charges are trapped in the floating gate, i.e. data "0" is written therein, the threshold value is shifted to a positive state, and the memory cell is turned off when the control gate is 0V. However, the memory cell is not limited to store a single bit, but may store a plurality of bits.

A following table 1 lists bias voltages applied in various operations of the flash memory. In a read operation, a certain positive voltage is applied to the bit line; a certain voltage (for example, 0V) is applied to the selected word line; the pass voltage Vpass (for example, 4.5V) is applied to the non-selected word lines; a positive voltage (for example, 4.5V) is applied to selection gate lines SGD and SGS to turn on a bit line selection transistor and a source line section transistor; and 0V is applied to a source line. In a programming (writing) operation, the programming voltage Vpgm with a high potential (15V-20V) is applied to the selected word line; the pass voltage Vpass with a middle potential (for example, 10V) is applied to the non-selected word lines; a power voltage Vcc is applied to the selection gate line SGD to turn on the bit line selection transistor, and 0V is applied to the selection gate line SGS to turn off the source line selection transistor; and a potential corresponding to the data "0" or "1" is provided to the bit line GBL.

TABLE 1

|  | Erase | Weak write | Write | Read |
|---|---|---|---|---|
| Selection word line | 0 | 12-13 V | 15-20 V | 0 |
| Non-selected word lines | F | — | 10 V | 4.5 |
| Selection gate line SGD | F | Vcc | Vcc | 4.5 |
| Selection gate line SGS | F | Vcc | 0 | 4.5 |
| Source line | F | 0 | Vcc | 0 |
| P-well | 20 | 0 | 0 | 0 |

In the erasing operation, a certain voltage (for example, 0V) is applied to the selected bit line in the block, i.e. the control gate, and an erasing pulse with a high potential (for example, 20V) is applied to the P-well to draw electrons of the floating gate to a substrate. In this way, data is erased block by block. In the erasing operation of the present embodiment, after the erasing pulse is applied, weak writing (programming) is performed, which is described later.

Figure 11:
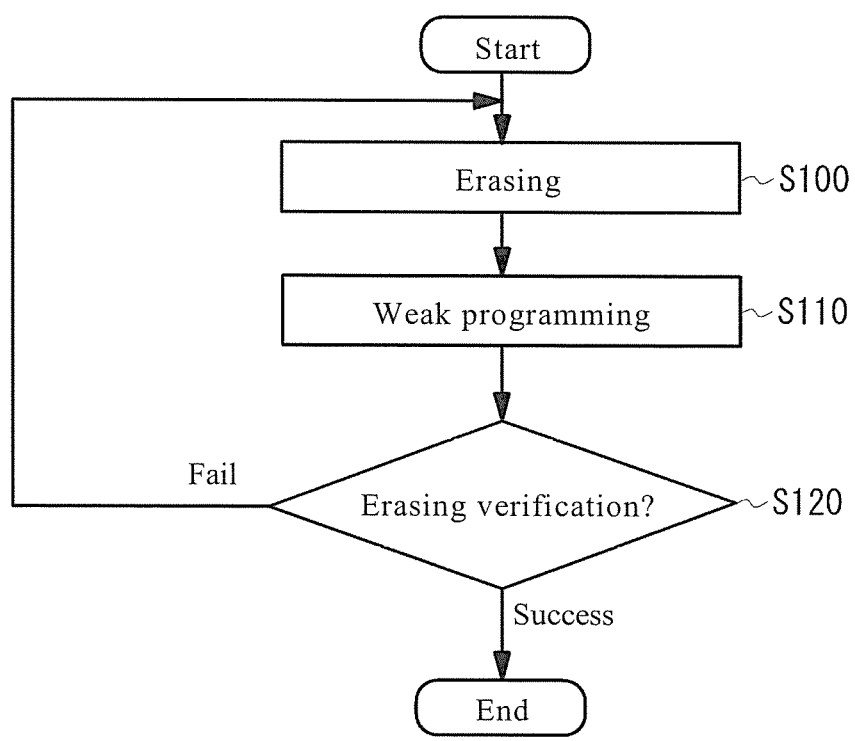
FIG. 11 is a flowchart illustrating an erasing operation of the flash memory according to the embodiment of the invention.

Then, the erasing operation of the flash memory of the present embodiment is described below. FIG. 11 is a flowchart illustrating the erasing operation according to the embodiment of the invention. First, the controller 150 starts the erasing operation after receiving an erasing command, etc. (S100). To be specific, the word line selection circuit 160 selects a block to be erased, and applies 0V to the word line of the selected block, and the erasing pulse Ps generated by the internal voltage generating circuit 190 is applied to the P-well. In this way, the oxide film right below the floating gate forms a high electric field, and a tunnel current of the electrons flows to the silicon substrate from the floating gate.

Then, the controller 150 executes weak programming to all of the memory cells of the selected block (S110), i.e. applies the weak programming voltage Vw_pgm (for example, 12-13V) lower than the programming voltage Vpgm in a general programming time to the word lines of all of the memory cells of the selected block, applies the power voltage Vcc to the selection gate lines SGD and SGS, and respectively applies 0V to the bit line GBL, the source line SL and the P-well, thereby performing week programming to all of the memory cells in the selected block.

By performing the weak programming, electrons are injected to the floating gate from the channel region of the silicon substrate through the gate oxide film, and at this time a part of the electrons is combined with the holes trapped in the oxide film to annihilate the holes. The longer a placing time of the memory cells after the erasing operation is, the larger the influence on deterioration of the oxide film is, so that it is referable to immediately execute the weak programming after applying the erasing pulse. Therefore, in the present embodiment, after the erasing pulse is applied, erasing verification is not performed, but the weak programming is immediately executed, and the erasing verification is performed after the weak programming is executed. Moreover, the weak programming suppresses de-trapping of the holes in the oxide film or formation of silicon interface energy level caused by the holes, so that verification of the weak programming is unnecessary.

After the weak programming is performed, the erasing verification is performed, and the erasing verification is to verify whether a threshold value of the memory cell is below a fixed value (S120). If it is determined to be failed in the erasing verification, the erasing pulse is again applied (S100), and then the weak programming is performed (S110). In this way, when it is verified that the threshold values of all of the memory cells of the selected block are below a verification voltage, the erasing operation is ended.

Figure 12:
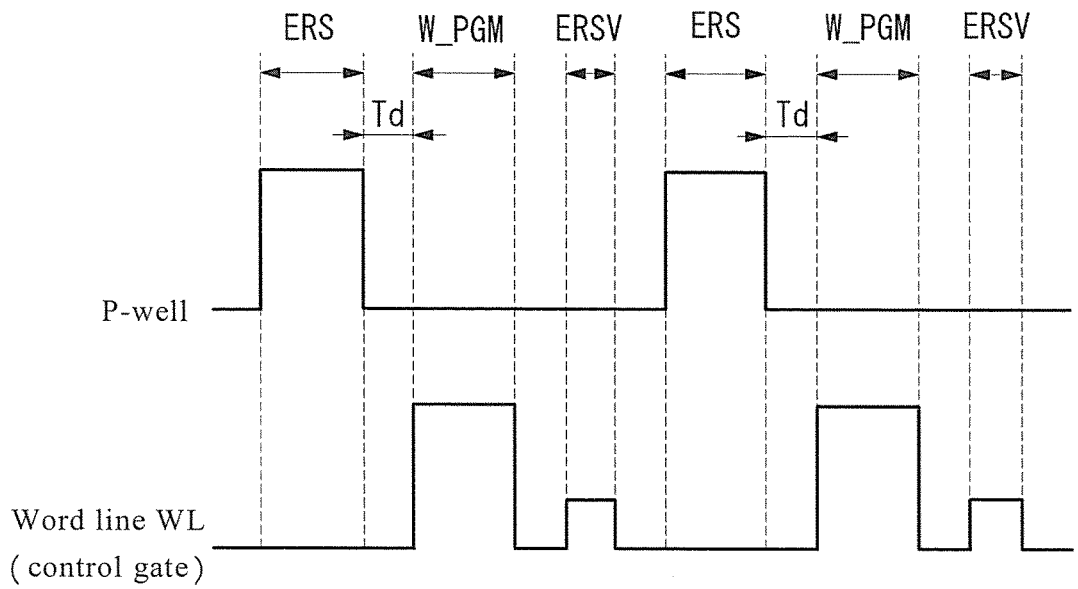
FIG. 12 is a timing chart of each part when an erasing operation is performed according to a first embodiment of the invention.
Figure 13:
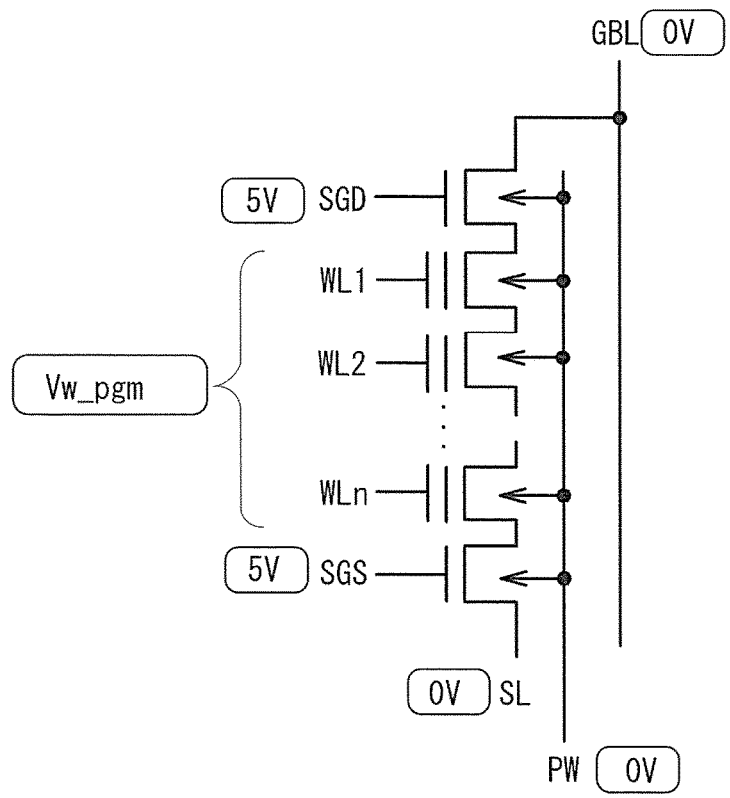
FIG. 13 is a diagram illustrating a bias condition when weak programming is performed according to the first embodiment of the invention.

FIG. 12 is a timing chart of the erasing operation of the present embodiment, and FIG. 13 is a diagram illustrating a bias condition when the weak programming is performed. As shown in FIG. 12, an erasing pulse (ERS) is applied to the P-well, and weak programming (W_PGM) is executed within a fixed time period Td after the erasing pulse ERS is applied to the P-well. The time period Td is, for example, 200 ms. The weak programming is to, as shown in FIG. 13, apply the weak programming voltage Vw_pgm to the word lines WL1-WLn of all of the memory cells of the selected block, apply 5V to the selection gate lines SGS, SGD to turn on the source line selection transistor and the bit line selection transistor, and apply 0V to the bit line GBL, the source line SL and the P-well. After the weak programming is performed, the erasing verification (ERSV) is performed.

The aforementioned embodiment presents an example of applying the erasing pulse through an incremental step pulse erasing (ISPE) method, though in case of applying a plurality of erasing pulses, a peak value of the present erasing pulse can be the same with that of the previous erasing pulse, or can be greater than that of the previous erasing pulse. Therefore, an applying time of the present erasing pulse can be the same with that of the previous erasing pulse, or can be greater than that of the previous erasing pulse.

Figure 14:
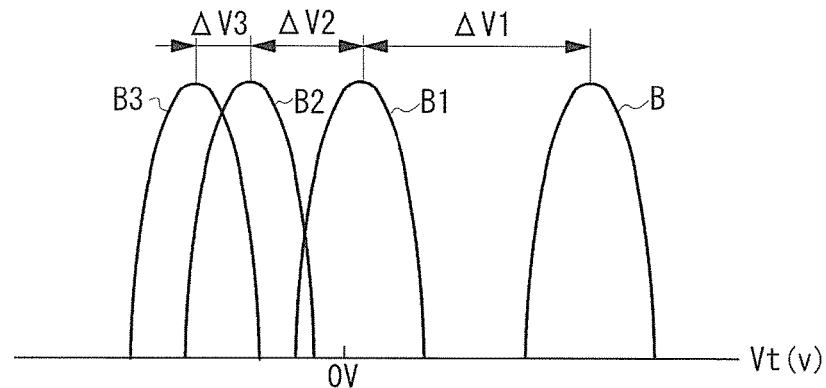
FIG. 14 illustrates a relationship between the number of applying times of an erasing pulse and a variation of a threshold value.

Then, a second embodiment of the invention is described below. FIG. 14 illustrates a relationship between the number of applying times of the erasing pulse and a variation of a distribution amplitude of the threshold value, in which following situations are presented, i.e. a distribution amplitude B of the programming state becomes a distribution amplitude B1 of the threshold value Vt varied by $\Delta V1$ due to applying of the first erasing pulse, becomes a distribution amplitude B2 of the threshold value Vt varied by $\Delta V2$ due to applying of the second erasing pulse, and becomes a distribution amplitude B3 of the threshold value Vt varied by $\Delta V3$ due to applying of the third erasing pulse. Generally, the variation of the threshold value Vt has following features, i.e. the variation is the maximum when the first erasing pulse is applied, and thereafter, the variation of the threshold value Vt is decreased ($\Delta V1 > \Delta V2 > \Delta V3$). When the variation of the threshold value Vt is the maximum, i.e. when the flow of the electrons from the floating gate to the silicon substrate is the maximum, a trapping amount of the holes in the oxide film reaches the maximum, and when the variation of the threshold value Vt is smaller, the trapping amount of the holes in the oxide film becomes smaller. Therefore, in the second embodiment, the weak programming voltage is varies according to the number of applying times of the erasing pulse i.e. the trapping amount of the holes.

Figure 15:
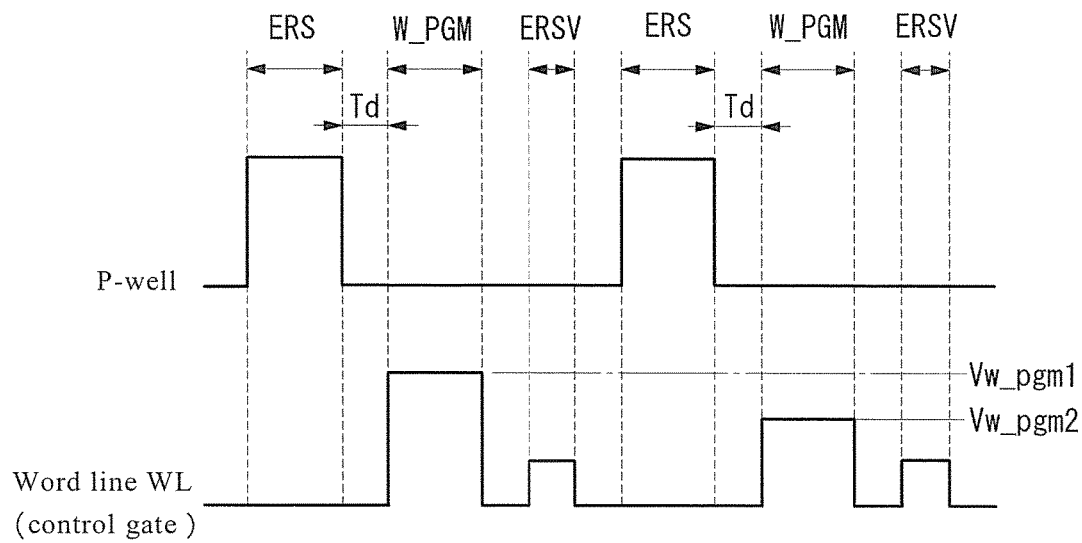
FIG. 15 is a time chart of each part when an erasing operation is performed according to a second embodiment of the invention.

FIG. 15 is a time chart of the erasing operation according to the second embodiment of the invention. As shown in FIG. 15, in the weak programming after the initial erasing pulse is applied, a weak programming voltage Vw_pgm1 is applied, and in the weak programming after the next erasing pulse is applied, a weak programming voltage Vw_pgm2 that is a little bit smaller than the weak programming voltage Vw_pgm1 is applied. In this way, the weak programming corresponding to the trapping amount of the holes in the oxide film can be performed to suppress injecting electrons more than requirement to the floating gate.

Figure 16:
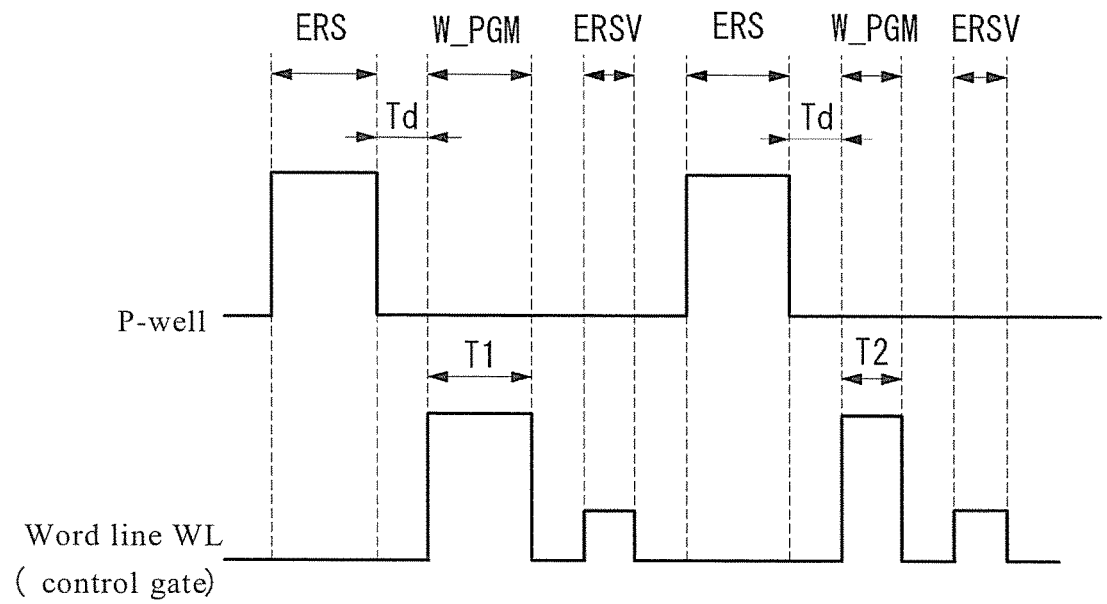
FIG. 16 is a timing chart of each part when an erasing operation is performed according to a variation of the second embodiment of the invention.

FIG. 16 is a timing chart of another erasing operation according to the second embodiment of the invention. In the present embodiment, in the weak programming after the initial erasing pulse is applied, a weak programming voltage Vw_pgm is applied within a time period T1, and in the weak programming after the next erasing pulse is applied, the weak programming voltage Vw_pgm is applied within a time period T2 shorter than the time period T1. In this way, both of optimisation of hole de-trapping and shortening of the erasing time can be taken into consideration.

Figure 17:
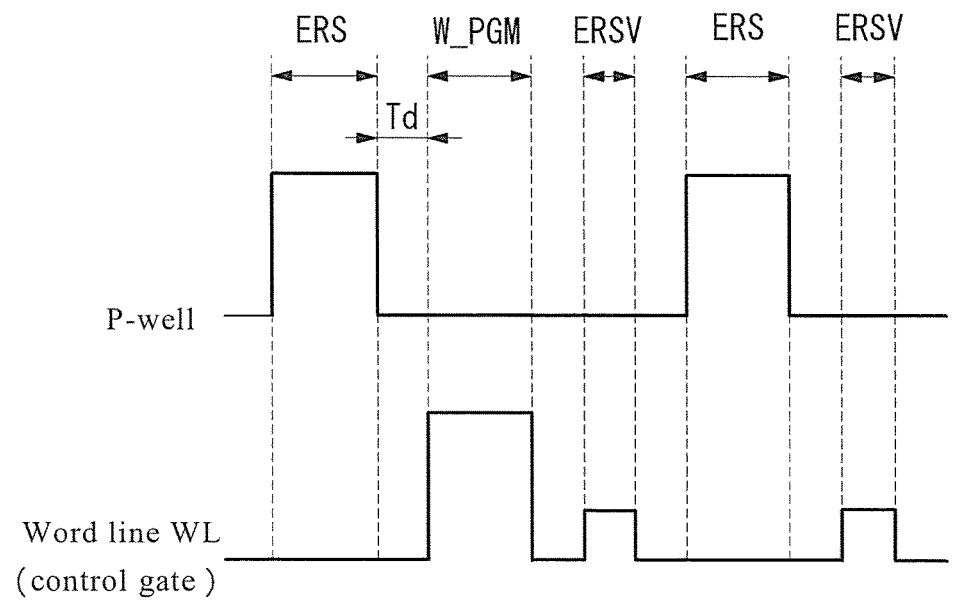
FIG. 17 is a timing chart of each part when an erasing operation is performed according to a variation of the second embodiment of the invention.

FIG. 17 is a timing diagram of another erasing operation according to the second embodiment of the invention. In the present embodiment, the weak programming is performed only after the initial erasing pulse is applied, and the weak programming is not performed after the second or more erasing pulse is applied. Here, the example of performing the weak programming only after the initial erasing pulse is applied is presented, though the weak programming can be performed in the predetermined number of times. In this way, both of optimisation of hole de-trapping and shortening of the erasing time can be taken into consideration. Unnecessary weak programming can be a factor for causing deterioration of the oxide film, so that in the second embodiment, the initial weak programming is immediately performed after the erasing step. Thereafter, considering both of the deterioration caused by programming and an amelioration effect due to immediate execution of the weak programming after the erasing step, the weak programming voltage can be gradually decreased or the weak programming is not performed by a fixed number of times.

In the aforementioned embodiment, examples for individually implementing the methods shown in FIG. 15 to FIG. 17 are presented, and these methods can be mutually combined. For example, by combining the method of the method shown in FIG. 15 and the method shown in FIG. 16, the initially applied weak programming voltage Vw_pgm1 and the time period T1 can be greater than the secondarily applied weak programming voltage Vw_pgm2 and the time period T2. Further, by combining the method shown in FIG. 17, in case of a plurality of erasing pulses is applied, the number of times, voltage magnitudes and time periods of the applied weak programming voltages can be suitably set.

In the aforementioned embodiment, implementations of the weak programming are presented, though the invention is not limited to the aforementioned implementations. The invention includes variations, replacements implemented by those skilled in the art according to the aforementioned implementations or structures or methods extracted from or associated with the aforementioned implementations.

Moreover, in the aforementioned embodiment, the NAND-type flash memory is introduced, though the invention is also adapted to erasing method of a NOR-type flash memory in which a memory cell has a control gate and a floating gate. Further, in the aforementioned embodiments, the flash memory with the memory cells, etc. formed on the surface of the silicon substrate in a two-dimensional manner is introduced, though the invention is also adapted to a flash memory with memory cells, etc. formed on the silicon substrate in a three-dimensional manner.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An erasing method of a non-volatile semiconductor memory device, the non-volatile semiconductor memory device comprising a memory array that forms a plurality of memory cells, wherein the memory cell comprises a control gate, a charge storage layer and a channel region, the erasing method of the non-volatile semiconductor memory device comprising:
   selecting step: selecting the memory cell to be erased from the memory array;
   erasing step: applying an erasing voltage to the channel region of the selected memory cell, and erasing data of the charge storage layer of the selected memory cell; and
   weak programming step: immediately applying a weak programming voltage lower than a programming voltage in a programming time to all of the control gates of the selected memory cell after the erasing step, thereby uniformly performing week programming to the selected memory cell,
   an erasing verification step: performing erasing verification of the selected memory cell after the weak programming step, and a present weak programming voltage is smaller than a previous weak programming voltage.

2. The erasing method of the non-volatile semiconductor memory device as claimed in claim 1, wherein the weak programming voltage is set to a value that is enough to suppress charges from being trapped by an insulation film between the charge storage layer and the channel region.

3. The erasing method of the non-volatile semiconductor memory device as claimed in claim 1, wherein the weak programming step is to make electrons to flow from the channel region to the charge storage layer, such that the electrons and holes trapped by the insulation film between the charge storage layer and the channel region are combined.

4. The erasing method of the non-volatile semiconductor memory device as claimed in claim 1, wherein the weak programming step is executed before an erasing verification step.

5. The erasing method of the non-volatile semiconductor memory device as claimed in claim 1, wherein the weak programming step is implemented within 200 ms after the erasing step is performed.

6. The erasing method of the non-volatile semiconductor memory device as claimed in claim 1, wherein when it is determined that erasing of the memory cell is failed through the erasing verification, the erasing step and the weak programming step are repeatedly performed until it is determined that the erasing of the memory cell is successful.

7. The erasing method of the non-volatile semiconductor memory device as claimed in claim 1, wherein an applying time of the present weak programming voltage is shorter than an applying time of the previous weak programming voltage.

8. The erasing method of the non-volatile semiconductor memory device as claimed in claim 1, wherein when the erasing step is repeatedly performed, the weak programming step is performed only when the initial erasing step is performed.

9. The erasing method of the non-volatile semiconductor memory device as claimed in claim 1, wherein when the erasing step is repeatedly performed, the weak programming step is performed by a predetermined number of times.

10. The erasing method of the non-volatile semiconductor memory device as claimed in claim 1, wherein the erasing step is to apply a voltage higher than that of the control gate to the channel region, and the weak programming step is to apply a voltage higher than that of the channel region to the control gate.

11. A non-volatile semiconductor memory device, comprising:
- a memory array, forming a plurality of memory cells, wherein the memory cell comprises a control gate, a charge storage layer and a channel region;
- a selection component, selecting the memory cell to be erased from the memory array; and
- an erasing component, erasing data of the memory cell selected by the selection component,
- wherein the erasing component applies an erasing voltage to the channel region of the selected memory cell to erase data of the charge storage layer of the selected memory cell, and after the erasing voltage is applied, the erasing component immediately applies a weak programming voltage lower than a programming voltage in a programming time to all of the control gates of the selected memory cell, so as to uniformly perform week programming to the selected memory cell,
- wherein the erasing component executes erasing verification of the selected memory cell after the weak programming, and the erasing component makes a present weak programming voltage to be smaller than a previous weak programming voltage.

12. The non-volatile semiconductor memory device as claimed in claim 11, wherein the weak programming voltage is set to a value that is enough to suppress charges from being trapped by an insulation film between the charge storage layer and the channel region.

13. The non-volatile semiconductor memory device as claimed in claim 11, wherein when the erasing component determines that erasing of the memory cell is failed through the erasing verification, the erasing component repeatedly performs the step of applying the erasing voltage and the step of applying the weak programming voltage until determining that the erasing of the memory cell is successful.

14. The non-volatile semiconductor memory device as claimed in claim 11, wherein when the erasing component repeatedly applies the erasing voltage, the erasing component applies the weak programming voltage by a predetermined number of times.

15. A non-volatile semiconductor memory device, comprising:
- a memory array, forming a plurality of memory cells, wherein the memory cell comprises a control gate, a charge storage layer and a channel region;
- a selection component, selecting the memory cell to be erased from the memory array; and
- an erasing component, erasing data of the memory cell selected by the selection component,
- wherein the erasing component applies an erasing voltage to the channel region of the selected memory cell to erase data of the charge storage layer of the selected memory cell, and after the erasing voltage is applied, the erasing component immediately applies a weak programming voltage lower than a programming voltage in a programming time to all of the control gates of the selected memory cell, so as to uniformly perform week programming to the selected memory cell,
- wherein the erasing component executes erasing verification of the selected memory cell after the weak programming, and the erasing component makes an applying time of a present weak programming voltage to be shorter than an applying time of a previous weak programming voltage.

* * * * *